US009065718B2

(12) United States Patent
Piesinger

(10) Patent No.: US 9,065,718 B2
(45) Date of Patent: Jun. 23, 2015

(54) COFDM USING PSEUDO ORTHOGONAL QPSK CODING

(71) Applicant: Gregory Hubert Piesinger, Cave Creek, AZ (US)

(72) Inventor: Gregory Hubert Piesinger, Cave Creek, AZ (US)

(*) Notice: Subject to any disclaimer, the term of this patent is extended or adjusted under 35 U.S.C. 154(b) by 0 days.

(21) Appl. No.: 14/449,618

(22) Filed: Aug. 1, 2014

(65) Prior Publication Data

US 2015/0036759 A1   Feb. 5, 2015

Related U.S. Application Data

(60) Provisional application No. 61/861,999, filed on Aug. 3, 213.

(51) Int. Cl.
*H04L 5/12* (2006.01)
*H04L 27/26* (2006.01)
*H04L 1/00* (2006.01)

(52) U.S. Cl.
CPC ............ *H04L 27/2698* (2013.01); *H04L 1/004* (2013.01); *H04L 1/0008* (2013.01)

(58) Field of Classification Search
CPC .............. H04L 27/265; H04L 27/2636; H04L 27/2634; H04L 27/2665; H04L 27/2698; H04L 5/0023

USPC .......... 375/260, 261, 267, 340, 343, 346, 347
See application file for complete search history.

(56) References Cited

U.S. PATENT DOCUMENTS

| 7,070,413 | B1* | 7/2006 | Wagner ........................ 433/214 |
| 8,098,773 | B1* | 1/2012 | Piesinger ..................... 375/341 |
| 8,396,147 | B2* | 3/2013 | Sadowsky et al. ............ 375/260 |
| 8,467,801 | B2* | 6/2013 | McCoy et al. ................ 455/450 |
| 2013/0132796 | A1* | 5/2013 | Vummintala et al. ......... 714/758 |

* cited by examiner

*Primary Examiner* — Dhaval Patel

(57) ABSTRACT

A Coded Orthogonal Frequency Division Multiplexing (COFDM) communication systems is implemented in which each subcarrier data stream is individually FEC encoded instead of FEC encoding the overall input data stream as implemented in conventional COFDM systems. Specifically, each subcarrier is independently encoded using pseudo orthogonal QPSK M-QAM FEC modulators, transmitted, and decoded using pseudo orthogonal QPSK M-QAM FEC demodulators. Multiplexers and demultiplexers randomize subcarrier symbols across all subcarriers to prevent contiguous subcarrier data errors due to fading or corruption by narrowband interference. This technology can be applied to many wireless and wired communication systems including wireless underwater RF communications.

18 Claims, 10 Drawing Sheets

COFDM USING PSEUDO ORTHOGONAL QPSK CODING

RELATED INVENTION

The present invention claims priority under 35 U.S.C. §119 (e) to: "COFDM using Pseudo Orthogonal QPSK Coding Method and Apparatus" Provisional U.S. Patent Application Ser. No. 61/861,999, filed 3 Aug. 2013 which is incorporated by reference herein.

TECHNICAL FIELD OF THE INVENTION

The present invention relates to the field of communications. More specifically, the present invention relates to a Coded Orthogonal Frequency Division Multiplexing (COFDM) wireless communication systems.

BACKGROUND OF THE INVENTION

Coded systems, which combine both Orthogonal Frequency Division Multiplexing (OFDM) and channel coding techniques, are used in communication systems to efficiently transmit high rate signals in fading channels. Due to the wide bandwidth of these signals they would normally suffer from severe frequency selective fading or isolated narrowband interference.

This is avoided in an OFDM system by dividing the data into multiple parallel data streams or channels, one for each subcarrier, where the transmission in each individual subcarrier experiences only flat frequency fading. Each subcarrier is modulated with a conventional modulation scheme such as quadrature amplitude modulation (QAM) at a low symbol rate, maintaining total data rates similar to conventional single carrier modulation schemes in the same bandwidth. Forward Error Correction (FEC) coding is used to combat errors resulting from noise, faded OFDM subcarriers, or isolated narrowband interference.

One of the primary disadvantages of OFDM is that it possesses a high peak-to-average-power ratio (PAPR) that requires the use of linear power amplifiers which are less efficient than nonlinear ones. Amplifier nonlinearity exhibits amplitude and phase distortions which cause loss of orthogonality among the subcarriers and introduces inter-carrier interference in the transmitted signal which increases bit error rate (BER). A number of techniques have been postulated to reduce PAPR but all suffer from either high complexity or low PAPR reduction. Amplitude clipping is the simplest technique but increases BER.

Accordingly, it is the object of the present invention to disclose methods which provide improved COFDM wireless communication system performance by reducing required signal-to-noise-ratio (SNR) and increasing immunity to amplifier nonlinearity.

SUMMARY OF THE INVENTION

Briefly, to achieve the desired object of the present invention, pseudo orthogonal QPSK coding will be applied to each OFDM subcarrier instead of applying FEC coding to the overall source data as in current COFDM systems. Pseudo orthogonal QPSK coding is described in commonly owned U.S. Pat. Nos. 8,098,773 and 8,437,431 which are incorporated herein by reference.

Pseudo orthogonal QPSK encodes message data using rate ½ Viterbi encoding. Symbols are decoded using an efficient sequential decoding algorithm in which all paths through the decoder tree are retained until it is certain that a particular path cannot be the correct path. It is a Shannon bound approaching code with superior error correction ability that can be used on short data packets.

Other objects and advantages of the present invention will become obvious as the preferred embodiments are described and discussed below.

DETAILED DESCRIPTION OF THE PREFERRED EMBODIMENTS

The primary goal of the present invention is to provide improved COFDM wireless communication system performance by reducing required SNR and reducing the effects of nonlinear amplifiers on BER.

Figure 1:
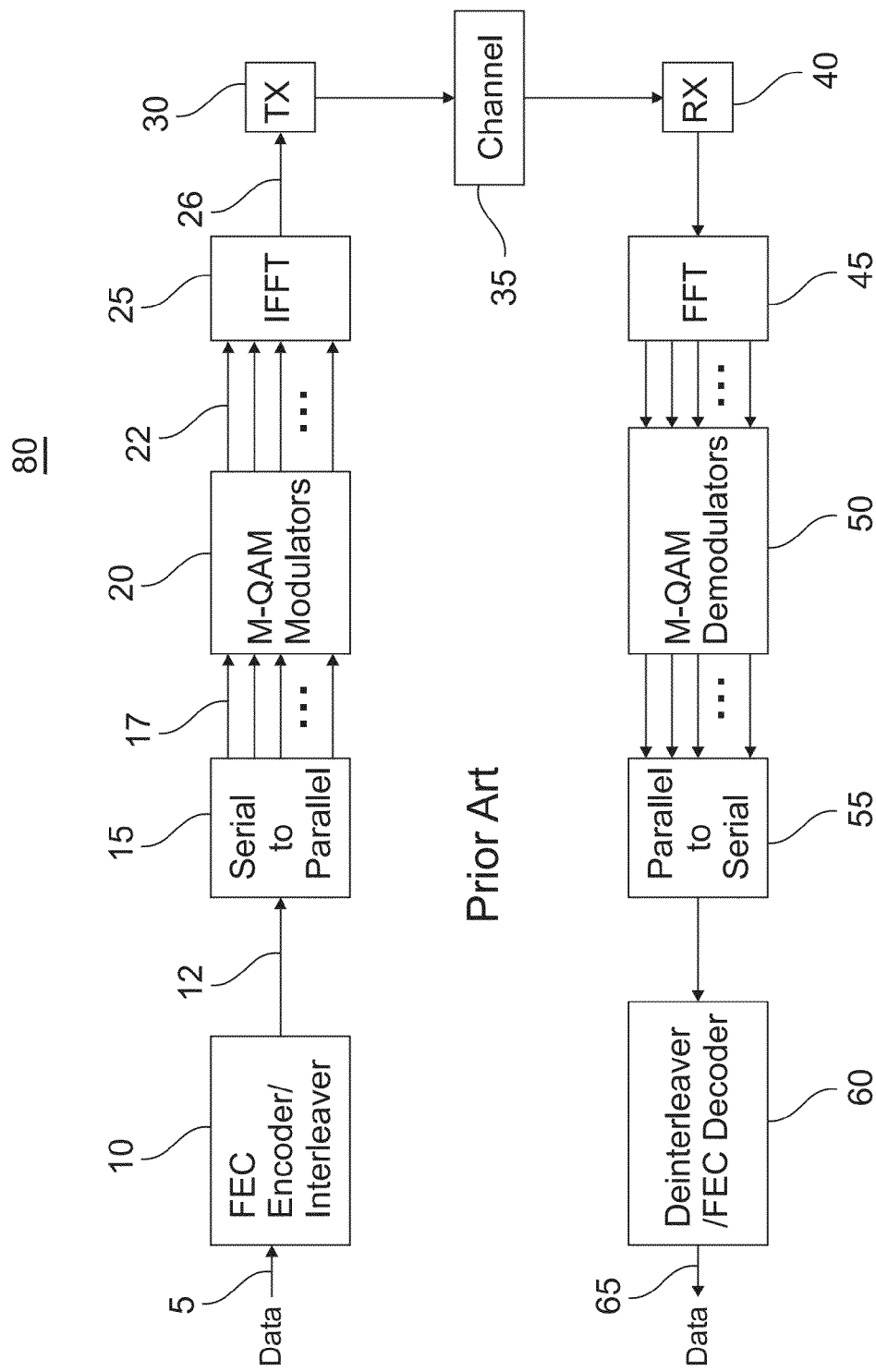
FIG. 1 illustrates a generic block diagram of a typical COFDM system.

A generic functional block diagram 80 of a typical COFDM system is illustrated in FIG. 1. High speed data input 5 is FEC encoded and interleaved 10. Interleaving is required to convert contiguous burst errors into separate single errors after final deinterleaving at the receiver. Encoded data 12 is serial to parallel converted 15 into parallel data streams 17 and functionally each data stream is modulated onto orthogonal subcarriers using M-QAM modulators 20. The frequency domain modulated subcarriers 22 are Inverse Fast Fourier Transformed (IFFT) 25 into a time domain signal that is amplified and transmitted 30 as a high speed analog waveform through channel 35.

M-QAM is m-ary quadrature amplitude modulation where m equal 2 is BPSK, m equal 4 is QPSK, m equal 16 is 16-QAM, and m equal 64 is 64-QAM.

Mathematically, modulating orthogonal waveforms and adding them is equivalent to taking a IFFT. This is because the time domain representation of OFDM is made up of different orthogonal sinusoidal signals which are nothing but an inverse Fourier transform. The IFFT can be thought of as converting frequency domain samples (modulation symbols created by M-QAM modulators 20) to time domain samples 26.

The high speed time domain analog waveform from channel 35 is received using receiver 40 and Fast Fourier Transformed (FFT) 45 to convert it back to modulated subcarriers in the frequency domain. Each subcarrier is demodulated using parallel M-QAM demodulators 50. Parallel to serial converter 55 converts the demodulated parallel subcarrier data back to high speed serial data which is deinterleaved and FEC decoded 60 to recover the original high speed data 65.

All blocks, except transmitter 30, channel 35, and receiver 40 in FIG. 1 are normally implemented digitally using high speed processors, Field Programmable Gate Arrays (FPGAs), Application Specific Integrated Circuits (ASCIs), or other digital means as is well known by those skilled in the art.

Figure 2:
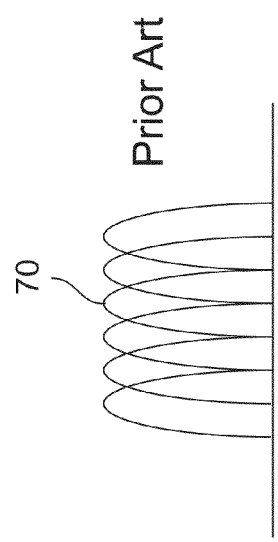
FIG. 2 illustrates multiple OFDM orthogonal subcarriers.
Figure 3:
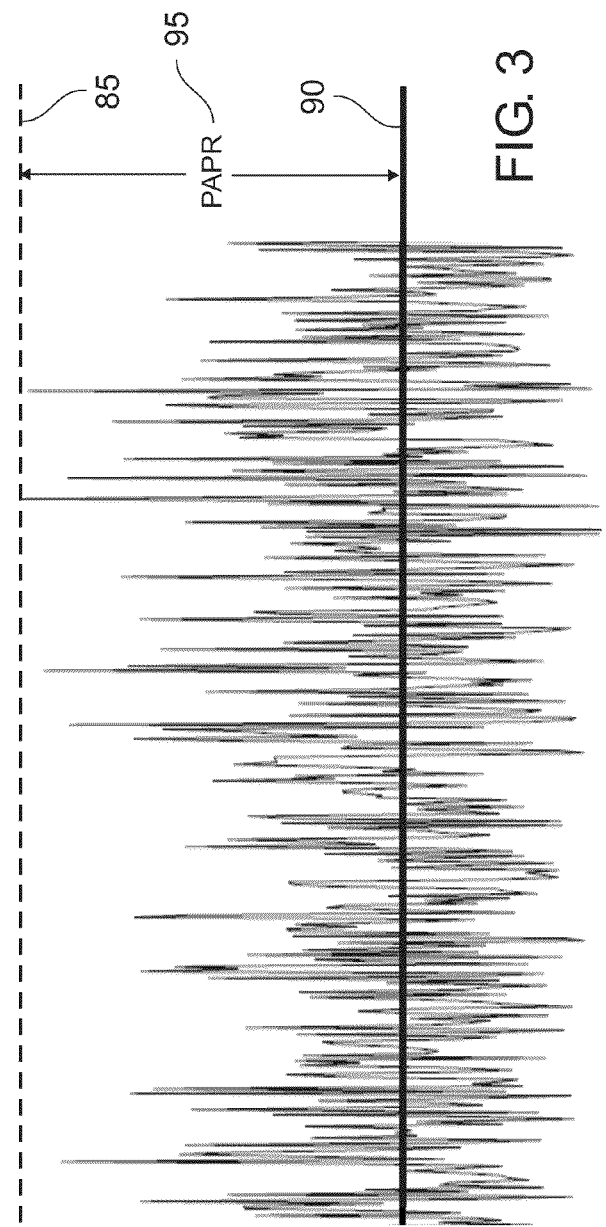
FIG. 3 illustrates an OFDM signal in the time domain along with its PAPR value.

The multiple OFDC subcarriers are illustrated in FIG. 2 in which all subcarriers 70 are orthogonal. The instantaneous amplitude of the transmitted signal is illustrated in FIG. 3 which indicates peak amplitude 85, average amplitude 90, and PAPR 95.

Figure 4:
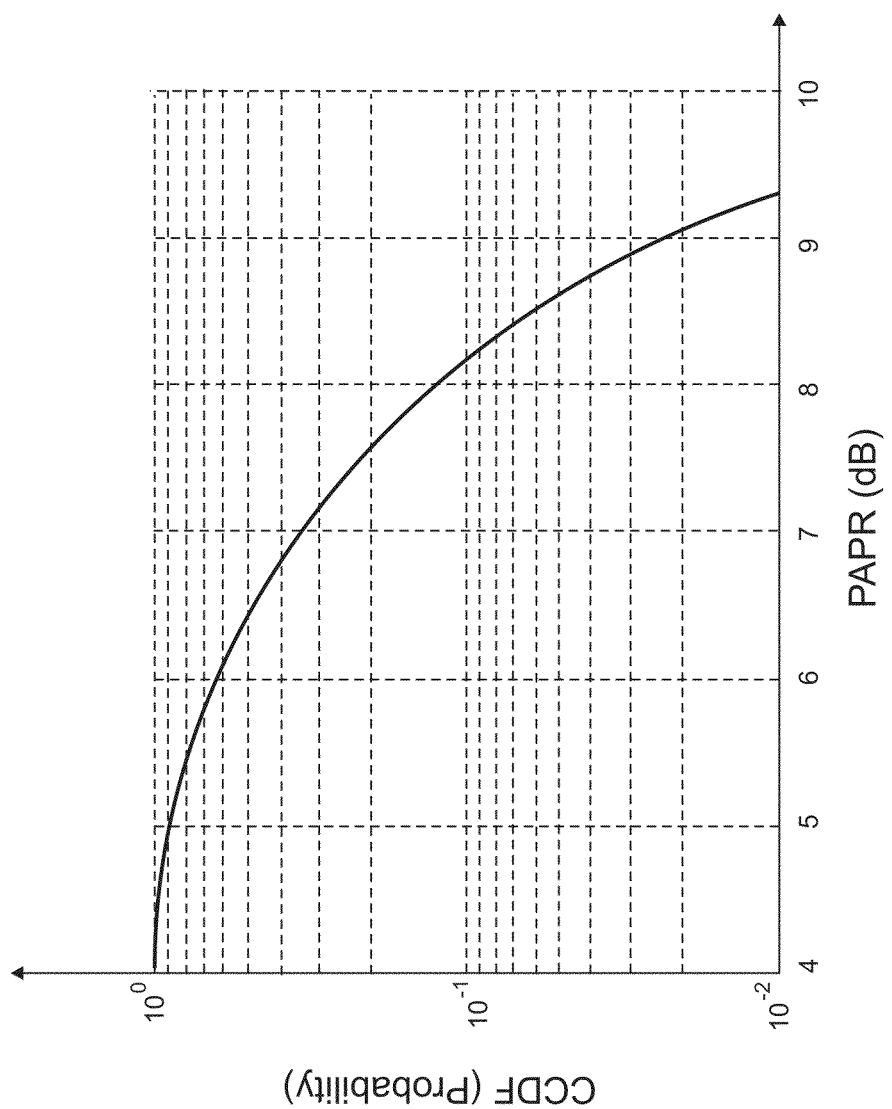
FIG. 4 illustrates the CCDF of a 64 subcarrier OFDM signal.

It is customary to use the Complementary Cumulative Distribution Function (CCDF) of the PAPR as a performance criterion. The CCDF of the PAPR is defined as the probability that the PAPR per OFDM symbol exceeds a certain clipping level. The CCDF for 64 OFDM carriers is illustrated in FIG. 4. This figure shows that the peak amplitude exceeds the average amplitude by 8 dB only approximately 10% of the time. If an 8 dB clipping level is implemented, then the PAPR would be 8 dB.

Figure 5:
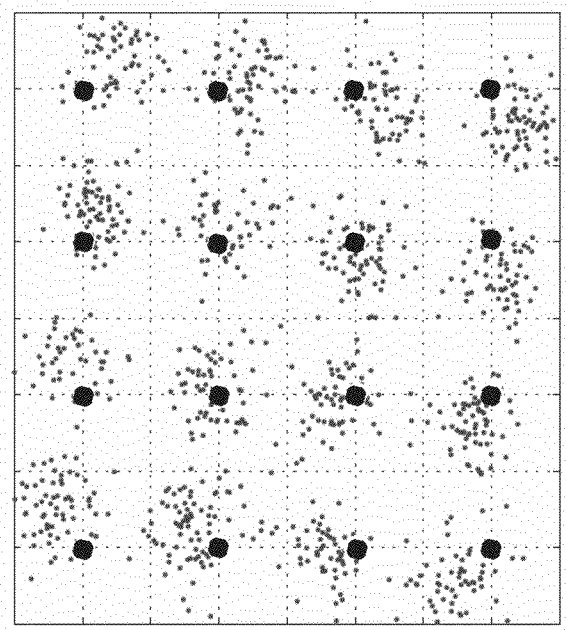
FIG. 5 illustrates the effect of clipping on a high SNR 16-QAM OFDM constellation.
Figure 6:
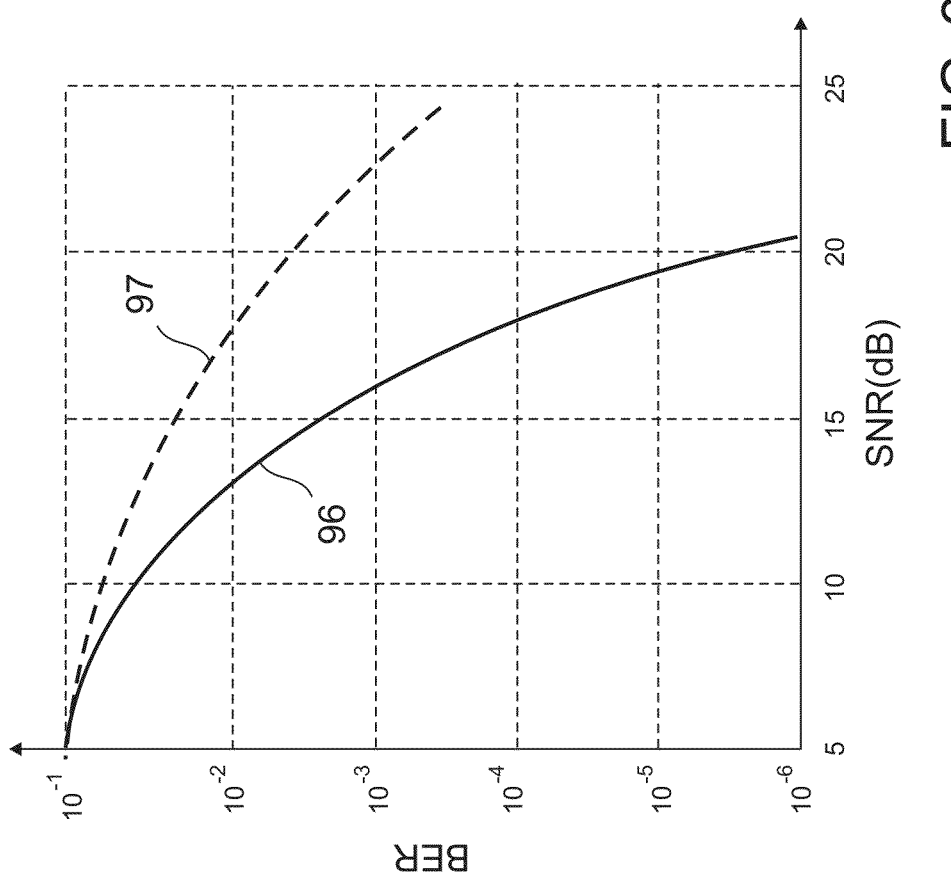
FIG. 6 illustrates typical BER degradation due to clipping for a 16-QAM OFDM signal.

The effect of clipping on the constellation diagram for a high SNR 16-QAM OFDM subcarrier is illustrated in FIG. 5. Clipping can cause Amplitude Modulation (AM) to AM conversion whose effect is to scatter the received symbol constellation. Clipping can also cause AM to Phase Modulation (PM) conversion whose effect is to slightly rotate the received symbol constellation. Both scattering and constellation rotation are illustrated in FIG. 5. The end effect is BER degradation as illustrated by curve 97 in FIG. 6 compared with curve 96 for 16-QAM without clipping.

Standard coding methods used in COFDM are designed to correct errors due to noise and faded subcarriers. However, their error correcting ability can be easily exceeded by the multitude of errors that can occur due to clipping as illustrated by the symbol constellation in FIG. 5 where many symbols are in error or nearly in error even at high SNR.

Figure 7:
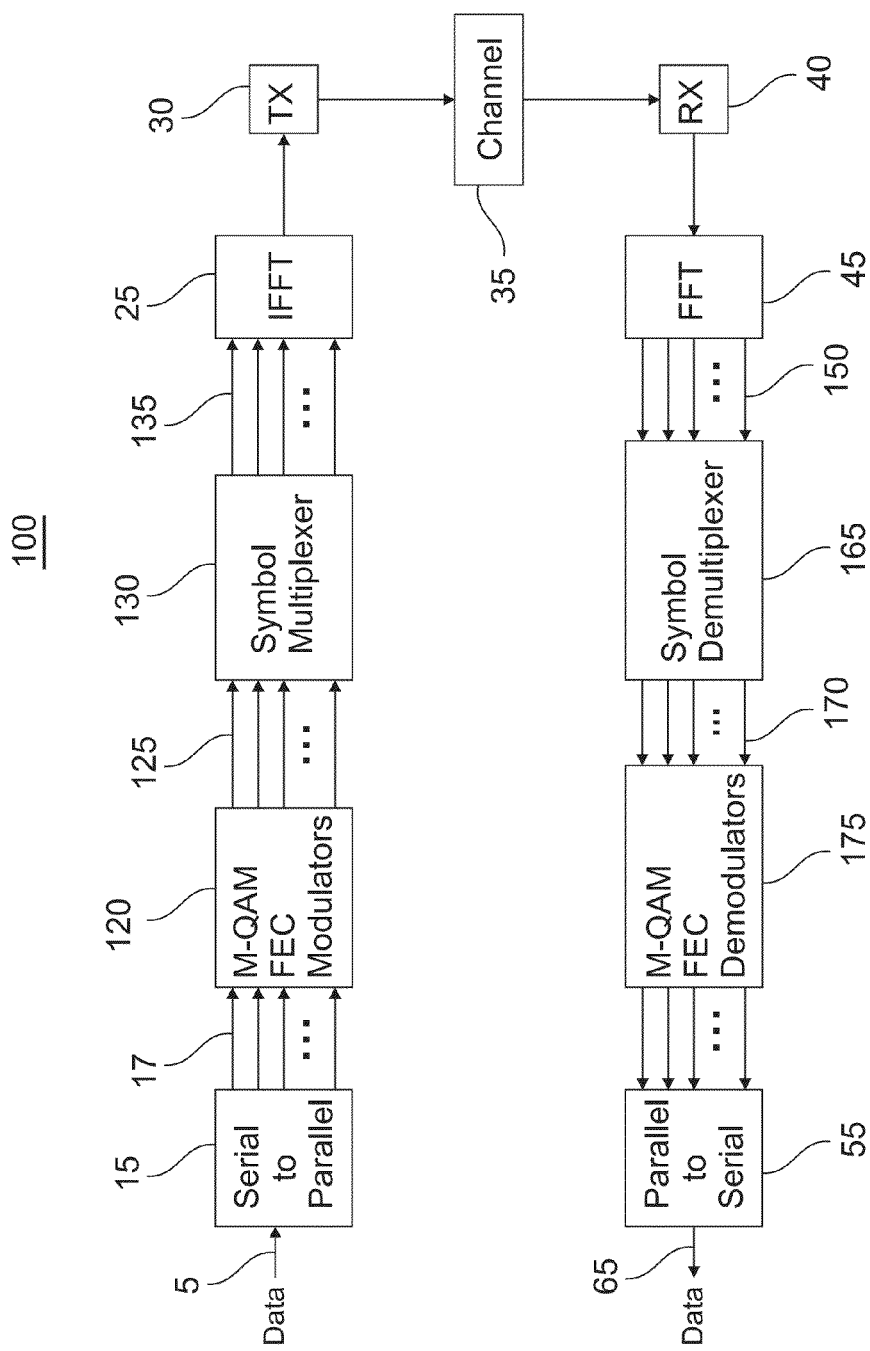
FIG. 7 illustrates a functional block diagram of the present invention CODFM system.

A functional block diagram 100 of the present invention COFDM communication system is illustrated in FIG. 7. Again all blocks, except transmitter 30, channel 35, and receiver 40 in FIG. 7 are digitally implemented using high speed processors, Field Programmable Gate Arrays (FPGAs), Application Specific Integrated Circuits (ASCIs), or other digital means. However, to facilitate understanding, each function is described and illustrated as a separate block even though some of the blocks can and will be combined and implemented digitally.

FEC encoder and interleaver 10 of FIG. 1 and deinterleaver and FEC decoder 60 of FIG. 1 are eliminated and high speed data input 5 is serial to parallel converted 15 into multiple slower parallel output data streams 17. Parallel M-QAM FEC modulators 120 create M-QAM FEC symbols 125 for each data stream. These M-QAM FEC symbols 125 are multiplexed in symbol multiplexer 130 to spread the symbols from any one parallel data stream across all data streams to prevent contiguous errors on any particular channel due to a faded subcarrier or narrowband interference.

Parallel data streams of multiplexed M-QAM FEC symbols 135 in the frequency domain each modulate an OFDM subcarrier, are summed together, and converted to the time domain in IFFT 25. This signal is amplified and transmitted 30 as a high speed analog waveform through channel 35 as in FIG. 1.

The signal from channel 35 is received using receiver 40 and FFT 45 converts it back to parallel modulated subcarriers 150 in the frequency domain. Symbol demultiplexer 165 demultiplexes the symbols back to the same parallel order they had prior to being multiplexed by symbol multiplexer 130.

Parallel M-QAM FEC demodulators 175 decodes these parallel QAM FEC symbol streams 170 back to parallel data streams which are serialized again in parallel to serial converter 55 thus completing the communication system link.

Figure 8:
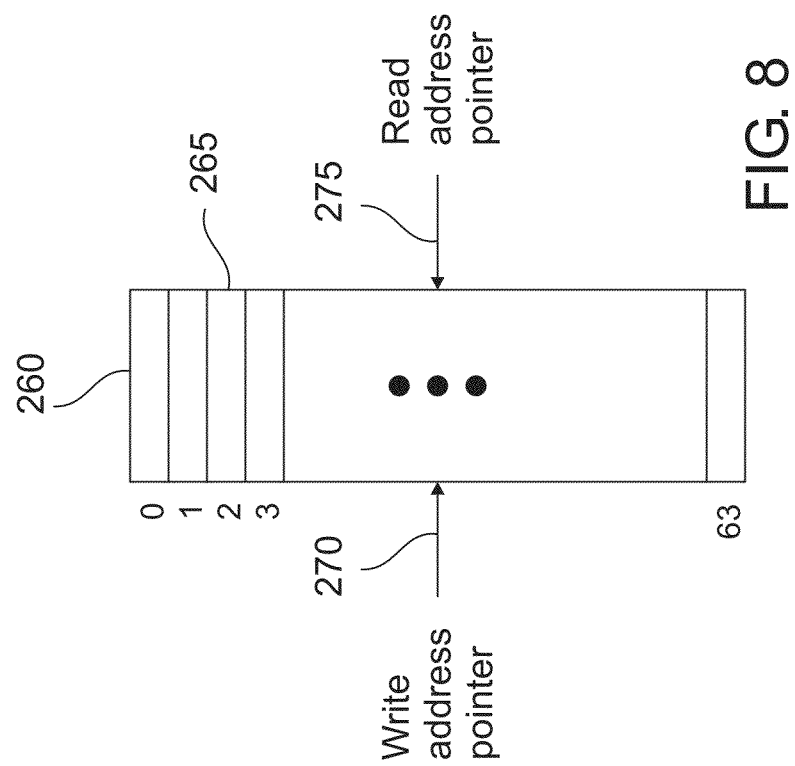
FIG. 8 illustrates a RAM implementation of a COFDM symbol multiplexer.

Symbol multiplexer 130 and symbol demultiplexer 165 can each be functionally implemented as a simple random access memory (RAM) 260 operating at the symbol period as illustrated in FIG. 8. For example, assume that 64 subcarriers (0 to 63) are implemented. Each symbol period, the 64 parallel symbols from M-QAM FEC modulators 120 are written to RAM 260 memory locations 265 using consecutive addresses from 0 to 63 generated by write address pointer 270. On the first symbol period, 64 symbols are read from RAM 260 memory locations 265 using consecutive addresses from 0 to 63 generated by read address pointer 275. At the second symbol period, read address pointer 275 uses consecutive addresses starting at address 1. At the third symbol period, read address pointer 275 starts at address 2 and so on in which the starting address is incremented by 1 for each consecutive symbol period. In this manner, consecutive data packet symbols from each channel of M-QAM FEC modulators 120 are spread across all subcarriers 70 illustrated in FIG. 2.

Symbol demultiplexer 165 operates in the same manner to reassemble parallel received symbols 150 from FFT 45 into the original M-QAM FEC modulators 120 parallel output order for M-QAM FEC demodulators 175. Furthermore, symbol multiplexer 130 and symbol demultiplexer 165 can be implemented to commence at a random address and proceed using non-consecutive addresses, including a repeating sequence of random addresses, if desired. This would further randomize the symbols across subcarriers to combat situations in which consecutive subcarriers are faded.

Symbol multiplexer 130 and symbol demultiplexer 165 can be eliminated in communication system applications where frequency selective fading or isolated narrowband interference does not occur. Examples are line of sight satellite and microwave links, and wired communication links in which multipath or interference is not a problem.

Applying FEC coding to each subcarrier instead of the overall data input allows more errors to be corrected. The number of errors that must be corrected in FIG. 1 is equal to the sum of errors that occur in each individual subcarrier. The number of errors that must be corrected in FIG. 7 is equal to the errors that occur in a single subcarrier.

Although any type of M-QAM FEC coding could be implemented in the present invention, pseudo orthogonal QPSK coding provides the most benefit. As explained in U.S. Pat. Nos. 8,098,773 and 8,437,431, pseudo orthogonal QPSK coding is very different than traditional coding methods. It is a Shannon bound approaching code that is error free as long as the correct path through the decoding tree is not eliminated. Closeness to the bound is primarily a function of hardware resources implemented to retain all paths through the decoder tree until a path is determined to not be the correct path.

The code works with small data packets, unlike turbo codes that require very large blocks of data and long interleaver latencies to approach the Shannon bound. Since the code works with short data packets, coding can be applied to each individual data channel of the M-QAM FEC modulators 120 instead of having to be applied to the total data across all subcarriers as in current COFDM systems as illustrated by blocks 10 and 60 of FIG. 1. The pseudo orthogonal QPSK code is also self randomizing so the use of large interleavers along with their associated large latency is avoided.

Pseudo orthogonal QPSK coding is most susceptible to consecutive or nearly consecutive large symbol errors which can erroneously eliminate the correct path. It is not susceptible to the low amplitude errors illustrated in FIG. 5 because multiple small errors (like noise) occur on all symbols, equally increases all path metrics, and will not eliminate the correct path.

Figure 9:
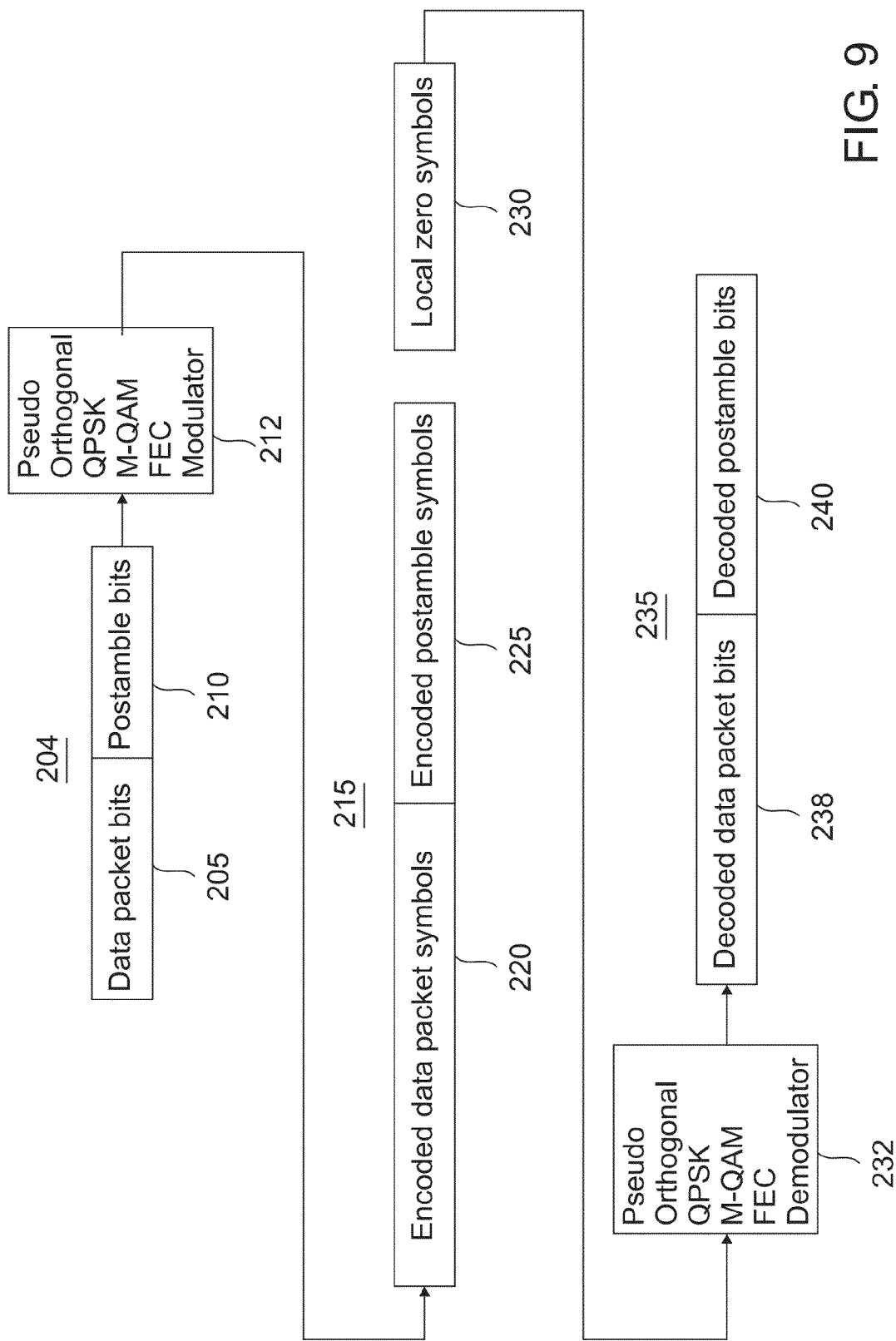
FIG. 9 shows data packet format prior to M-QAM FEC encoding, after encoding, prior to decoding, and after decoding.

To ensure that the correct path is identified, each parallel data stream out of serial to parallel converter 15 in FIG. 7 can be divided into data packet bits 205 prior to sending them to the pseudo orthogonal QPSK M-QAM FEC modulator 212 as illustrated in FIG. 9.

To flush out the correct path at the end of each data packet bits 205, each encoder data packet 204 will include a few postamble bits prior to being encoded in pseudo orthogonal QPSK M-QAM FEC modulator 212 so as to end the encoded data packet 215 in the encoder zero state as illustrated in FIG. 9.

Encoded data packet 215 consists of encoded data packet symbols 220 created from data packet bits 205 and encoded postamble symbols 225 created from postamble bits 210 which consists of a number of "zero" encoder input bits, the number related to the constraint length of the Viterbi encoder, which returns pseudo orthogonal QPSK M-QAM FEC modulator 212 Viterbi encoder to its zero state.

The convolutional decoder described in U.S. Pat. Nos. 8,098,773 and 8,437,431 retains all paths through the decoder tree until it is certain a path is not the correct path. At the end of the data packet, in a noisy communication environment, the minimum metric path may not be the correct path.

When encoded data packet 215 is received, a number of noiseless locally generated zero symbols 230 are added to the end of received encoded data packet 215 prior to decoding. Since added local zero symbols 230 are noiseless, they quickly eliminate all incorrect paths thus defining the correct path in pseudo orthogonal QPSK M-QAM FEC demodulator 232 and thus the correct decoded data packet 235. The decoded postamble bits 240 of decoded data packet 235 are discarded and the decoded data packet bits 238 (same as original transmitted data packet bits 205) are sent to parallel to serial converter 55.

Figure 10B:
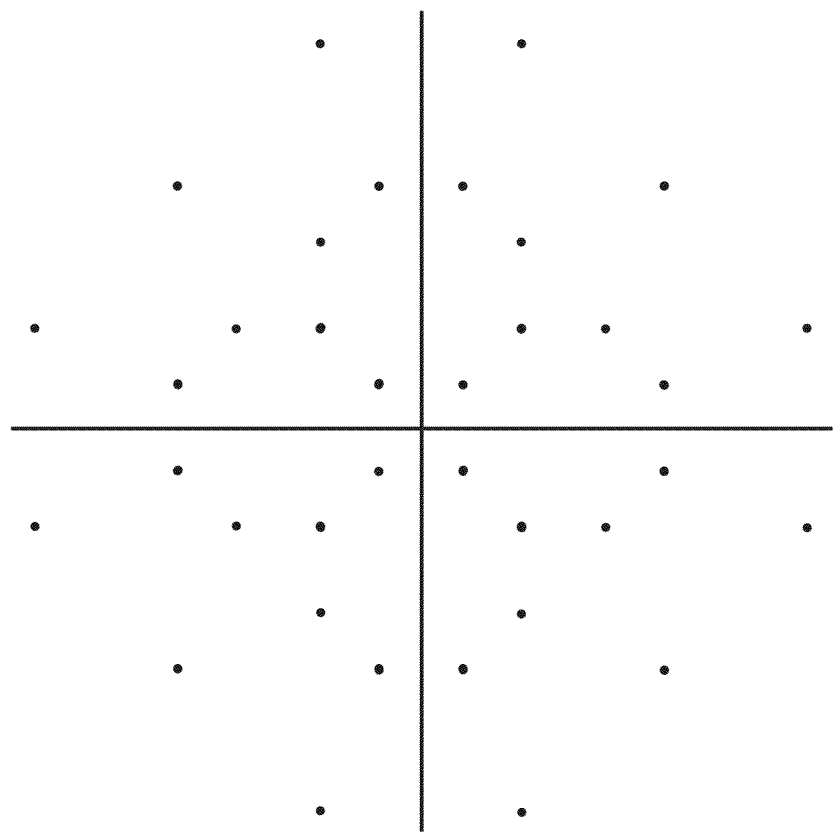
FIGS. 10a and 10b show versions of 16-QAM and 64-QAM constellations respectively for pseudo orthogonal QPSK M-QAM FEC modulation.
Figure 10A:
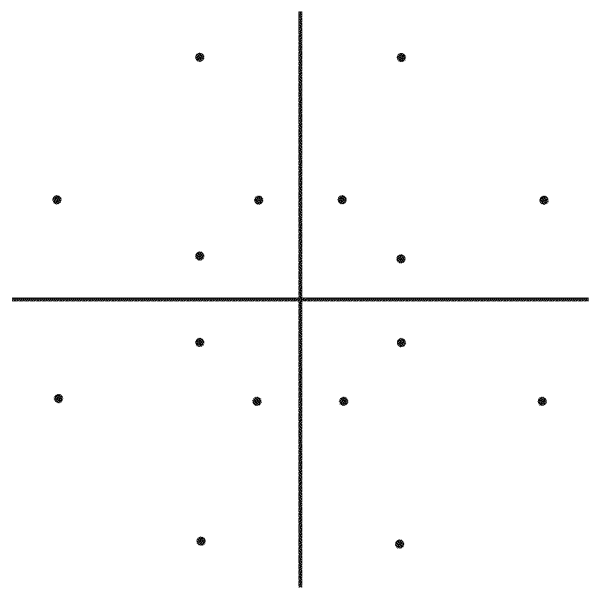

Currently, most COFDM systems are designed to increase data rate and combat fading in high speed wireless communication systems such as cellular, Wi-Fi, etc. For these applications, the rate ½ pseudo orthogonal 16-QAM constellation illustrated in FIG. 10a provides 2 bits/symbol and the 64-QAM constellation illustrated in FIG. 10b provides 3 bits/symbol.

Both of these constellations provide low BER at much lower SNR than conventional COFDM implementations. This allows lower transmitter power to be used for equivalent communications range. Operating the same transmitter linear amplifiers at lower power reduces their amplitude and phase distortion that causes loss of orthogonality among the subcarriers and introduces inter-carrier interference.

Figure 11:
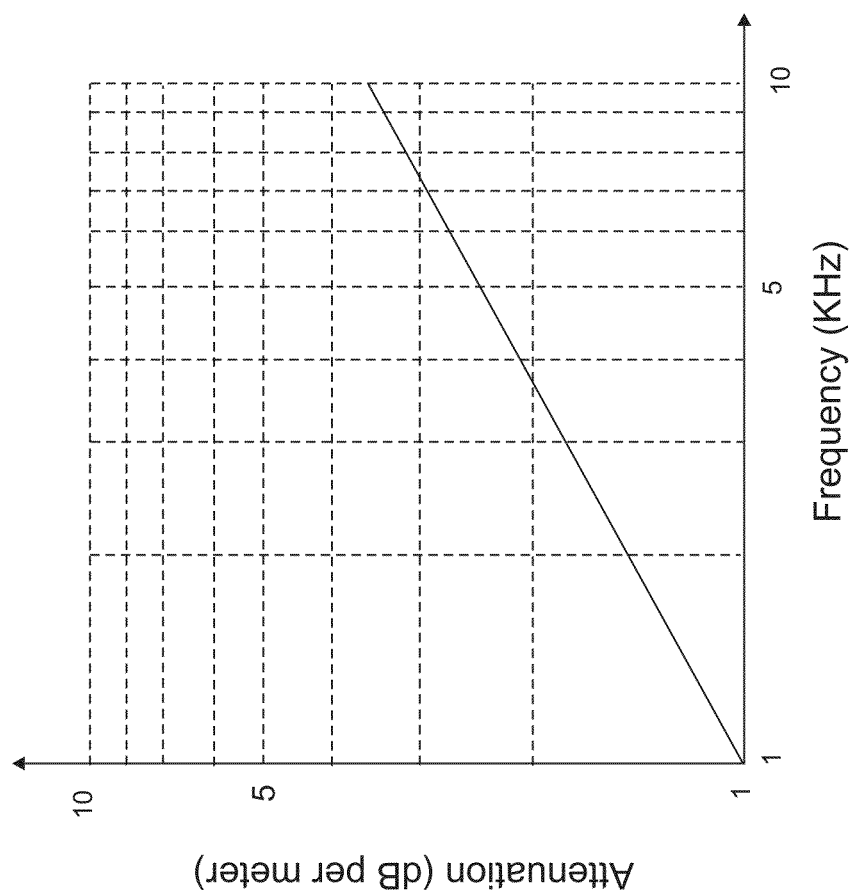
FIG. 11 illustrates typical attenuation of sea water in an underwater RF communication system.

Another potential COFDM application of the present invention is for underwater RF where high increasing attenuation of water at increasing frequency is the most important problem. The attenuation of sea water with frequency is approximately 1 dB per meter at 1 KHz and 3.5 dB per meter at 10 KHz as illustrated in FIG. 11. Using multiple COFDM subcarriers as described in this application provides nearly flat attenuation across each subcarrier. Excessive attenuation with frequency across subcarriers will reduce the orthogonality of the subcarriers. Also, multipath fading and isolated narrowband interference is not a problem in most underwater RF applications because the longer reflected path signal is highly attenuated with respect to the direct path signal so fading does not occur. In those applications, symbol multiplexer 130 and symbol demultiplexer 165 in FIG. 7 can be eliminated.

Another advantage of the convolutional decoder described in U.S. Pat. Nos. 8,098,773 and 8,437,431 is that parallel or serial processing can be used to calculate residuals on a path-by-path basis. For low data rate systems like underwater RF, very high order rate ½ pseudo orthogonal QPSK M-QAM modulators and demodulators can be implemented which increases the bits per symbol and allows more information to be transmitted per data packet without having to increase the data rate or bandwidth. With underwater RF, 256-QAM (4 bits/symbol), 1024-QAM (5 bits/symbol), and 4096-QAM (6 bits/symbol) can be implemented. This is possible because modern high speed application specific integrated circuits (ASICs), field programmable gate arrays (FPGAs), and processors operate at rates of hundreds of thousands or even millions of operations per underwater RF data symbol period. Processing and memory resources can be time shared among all the decoder paths thus making it possible to implement very high order pseudo orthogonal QPSK M-QAM systems.

Although the examples presented herein were described for wireless OFDM applications like cellular, Wi-Fi, and underwater RF, this invention is applicable for numerous other wireless and wired communication applications such as satellite, digital subscriber line (DSL), etc. which require increased data rates without increased signal power or bandwidth. Many simple modifications to the described system are possible without departing from the spirit of the invention.

What is claimed is:

1. A method for implementing a COFDM communication system to improve performance and reduce effects of amplifier nonlinearity, said method comprising:
   converting a serial input data stream to multiple slower parallel output data streams;
   applying FEC coding to each said parallel output data streams using a parallel bank of pseudo orthogonal QPSK M-QAM FEC modulators to create parallel streams of M-QAM FEC symbols from each said parallel output data streams;
   creating modulated OFDM subcarriers for each said parallel streams of M-QAM FEC symbols and converting sum of said modulated OFDM subcarriers to a COFDM signal;
   transmitting said COFDM signal through a communication channel;
   receiving said COFDM signal from said communication channel;
   converting said COFDM signal to said parallel streams of M-QAM FEC symbols;
   demodulating each said parallel streams of M-QAM FEC symbols using a parallel bank of pseudo orthogonal QPSK M-QAM FEC demodulators to create said parallel output data streams from each said parallel streams of M-QAM FEC symbols; and
   parallel to serial converting said parallel output data streams to a serial data stream.

2. A method as claimed in claim 1 additionally comprising:
   dividing each said parallel output data streams into data packet bits prior to sending them to said M-QAM FEC modulators;

appending postamble bits to each said data packet bits wherein said postamble bits contain said M-QAM FEC modulators zero bits used to return said M-QAM FEC modulators to their zero state;

appending noiseless local zero symbols to each received encoded data packet of said parallel streams of M-QAM FEC symbols, said local zero symbols used to eliminate all incorrect trellis decoding paths in said M-QAM FEC demodulators thus identifying the correct decoder path and correct decoded data packet bits; and discarding said decoded postamble bits from said M-QAM FEC demodulators said parallel output data streams.

3. A method as claimed in claim 1 wherein M-QAM constellation is a rate 1/2 pseudo orthogonal QPSK 16-QAM constellation.

4. A method as claimed in claim 1 wherein M-QAM constellation is a rate 1/2 pseudo orthogonal QPSK 64-QAM constellation.

5. A method as claimed in claim 1 wherein said creating modulated OFDM subcarriers for each said parallel streams of M-QAM FEC symbols and converting sum of said modulated OFDN subcarriers to a COFDM signal is implemented using an IFFT.

6. A method as claimed in claim 1 wherein said converting said COFDM signal to said parallel streams of M-QAM FEC symbols is implemented using an FFT.

7. A method for implementing a COFDM communication system to improve performance and reduce effects of amplifier nonlinearity, said method comprising:

converting a serial input data stream to multiple slower parallel output data streams;

applying FEC coding to each said parallel output data streams using a parallel bank of M-QAM FEC modulators to create parallel streams of pseudo orthogonal QPSK M-QAM FEC symbols from each said parallel output data streams;

multiplexing said parallel streams of M-QAM FEC symbols to form parallel streams of multiplexed M-QAM FEC symbols;

creating modulated OFDM subcarriers for each said parallel streams of multiplexed M-QAM FEC symbols and converting sum of said modulated OFDM subcarriers to a COFDM signal;

transmitting said COFDM signal through a communication channel;

receiving said COFDM signal from said communication channel;

converting said COFDM signal to said parallel streams of multiplexed M-QAM FEC symbols;

demultiplexing said parallel streams of multiplexed M-QAM FEC symbols to said parallel streams of M-QAM FEC symbols;

demodulating each said parallel streams of M-QAM FEC symbols using a parallel bank of pseudo orthogonal QPSK M-QAM FEC demodulators to create said parallel output data streams from each said parallel streams of M-QAM FEC symbols; and parallel to serial converting said parallel output data streams to a serial data stream.

8. A method as claimed in claim 7 additionally comprising:

dividing each said parallel output data streams into data packet bits prior to sending them to said M-QAM FEC modulators;

appending postamble bits to each said data packet bits wherein said postamble bits contain said M-QAM FEC modulators zero bits used to return said M-QAM FEC modulators to their zero state;

appending noiseless local zero symbols to each received encoded data packet of said parallel streams of M-QAM FEC symbols, said local zero symbols used to eliminate all incorrect trellis decoding paths in said M-QAM FEC demodulators thus identifying the correct decoder path and correct decoded data packet bits; and discarding said decoded postamble bits from said M-QAM FEC demodulators said parallel output data streams.

9. A method as claimed in claim 7 wherein M-QAM constellation is a pseudo orthogonal 16-QAM constellation.

10. A method as claimed in claim 7 wherein M-QAM constellation is a pseudo orthogonal 64-QAM constellation.

11. A method as claimed in claim 7 wherein said creating modulated OFDM subcarriers for each said parallel streams of multiplexed M-QAM FEC symbols and converting sum of said modulated OFDN subcarriers to a COFDM signal is implemented using an IFFT.

12. A method as claimed in claim 7 wherein said converting said COFDM signal to said parallel streams of multiplexed M-QAM FEC symbols is implemented using an FFT.

13. A method as claimed in claim 7 wherein said multiplexing said parallel streams of M-QAM FEC symbols to form parallel streams of multiplexed M-QAM FEC symbols is implemented using a RAM.

14. A method for implementing a COFDM underwater RF communication system to provide nearly flat attenuation across each subcarrier, said method comprising:

converting a serial input data stream to multiple slower parallel output data streams;

applying pseudo orthogonal QPSK coding to each said parallel output data streams using a parallel bank of pseudo orthogonal QPSK M-QAM FEC modulators to create parallel streams of pseudo orthogonal QPSK M-QAM FEC symbols from each said parallel output data streams;

creating modulated OFDM subcarriers for each said parallel streams of pseudo orthogonal QPSK M-QAM FEC symbols and converting sum of said modulated OFDN subcarriers to a COFDM signal;

transmitting said COFDM signal through an underwater communication channel;

receiving said COFDM signal from said underwater communication channel;

converting said COFDM signal to said parallel streams of pseudo orthogonal QPSK M-QAM FEC symbols;

demodulating each said parallel streams of pseudo orthogonal QPSK M-QAM FEC symbols using a parallel bank of pseudo orthogonal QPSK M-QAM FEC demodulators to create said parallel output data streams from each said parallel streams of pseudo orthogonal QPSK M-QAM FEC symbols; and parallel to serial converting said parallel output data streams to a serial data stream.

15. A method as claimed in claim 14 additionally comprising:

dividing each said parallel output data streams into data packet bits prior to sending them to said pseudo orthogonal QPSK M-QAM FEC modulators;

appending postamble bits to each said data packet bits wherein said postamble bits contain said pseudo orthogonal QPSK M-QAM FEC modulators zero bits used to return said pseudo orthogonal QPSK M-QAM FEC modulators to their zero state;

appending noiseless local zero symbols to each received encoded data packet of said parallel streams of pseudo orthogonal QPSK M-QAM FEC symbols, said local zero symbols used to eliminate all incorrect trellis decoding paths in said pseudo orthogonal QPSK M-QAM FEC demodulators thus identifying the correct decoder path and correct decoded data packet bits; and discarding decoded said postamble bits from said pseudo orthogonal QPSK M-QAM FEC demodulators said parallel output data streams.

16. A method as claimed in claim 14 wherein said pseudo orthogonal QPSK M-QAM constellation is a rate 1/2 pseudo orthogonal 256-QAM constellation.

17. A method as claimed in claim 14 wherein said pseudo orthogonal QPSK M-QAM constellation is a rate 1/2 pseudo orthogonal 1024-QAM constellation.

18. A method as claimed in claim 14 wherein said pseudo orthogonal QPSK M-QAM constellation is a rate 1/2 pseudo orthogonal 4096-QAM constellation.

* * * * *